(12) United States Patent
Nara et al.

(10) Patent No.: US 6,437,354 B1
(45) Date of Patent: Aug. 20, 2002

(54) EXPOSURE METHOD AND SCANNING-TYPE EXPOSURE APPARATUS

(75) Inventors: Kei Nara, Yokohama; Hirokazu Kato, Ageo, both of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/610,306

(22) Filed: Jul. 5, 2000

Related U.S. Application Data

(63) Continuation of application No. PCT/JP98/05854, filed on Dec. 24, 1998.

(30) Foreign Application Priority Data

Jan. 7, 1998 (JP) .......................................... 10-013431

(51) Int. Cl.⁷ ............................................ H01L 21/027
(52) U.S. Cl. ........................ 250/548; 355/52; 355/53; 355/55; 356/399; 356/400; 356/401
(58) Field of Search ...................... 250/548; 355/52, 355/53, 55; 356/399, 400, 401

(56) References Cited

U.S. PATENT DOCUMENTS

| | | | |
|---|---|---|---|
| 4,958,160 A | | 9/1990 | Ito et al. .......................... 355/53 |
| 5,602,620 A | * | 2/1997 | Miyazaki et al. ............... 355/53 |
| 5,617,181 A | * | 4/1997 | Yanagihara et al. ........... 355/46 |
| 5,617,211 A | * | 4/1997 | Nara et al. .................... 356/401 |
| 5,625,436 A | * | 4/1997 | Yanagihara et al. ........... 355/53 |
| 5,715,037 A | * | 2/1998 | Saiki et al. ..................... 355/53 |
| 5,936,712 A | * | 8/1999 | Ito et al. ......................... 355/55 |
| 5,978,094 A | * | 11/1999 | Narabe et al. ............... 356/401 |
| 5,999,244 A | * | 12/1999 | Yanagihara et al. ........... 355/53 |
| 6,195,153 B1 | * | 2/2001 | Shimizu ......................... 355/53 |
| 6,208,407 B1 | * | 3/2001 | Loopstra ........................ 355/53 |
| 6,258,495 B1 | * | 7/2001 | Okamura et al. .............. 430/22 |
| 6,266,131 B1 | * | 7/2001 | Hamada et al. ................ 355/53 |
| 6,288,772 B1 | * | 9/2001 | Shinozaki et al. ............. 355/53 |

FOREIGN PATENT DOCUMENTS

| | | |
|---|---|---|
| JP | 63-128713 | 6/1988 |
| JP | 4-235559 | 8/1992 |

* cited by examiner

Primary Examiner—Robert H. Kim
Assistant Examiner—Allen C. Ho
(74) Attorney, Agent, or Firm—Oliff & Berridge, PLC

(57) ABSTRACT

Exposure method and scanning-type exposure apparatus expose a substrate with a pattern formed on a mask by synchronously moving the mask and the substrate. The exposure apparatus comprises a detection device and a correction mechanism. The detection device detects a change in a shape of the substrate. The correction mechanism approximates at least two straight lines or curves in accordance with the result of the detection by the detection device to correct the relative position of the mask and the substrate during the synchronous movements.

20 Claims, 12 Drawing Sheets

FIG. 13
(a) 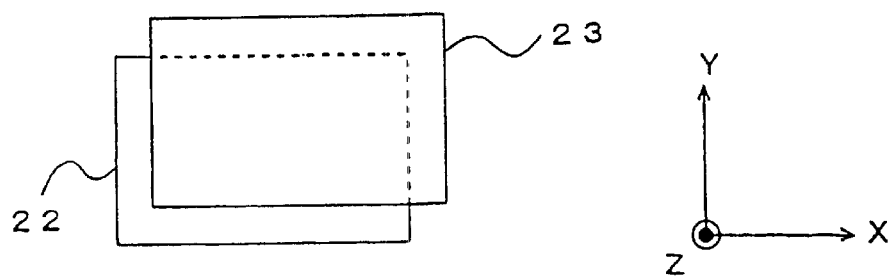
(b) 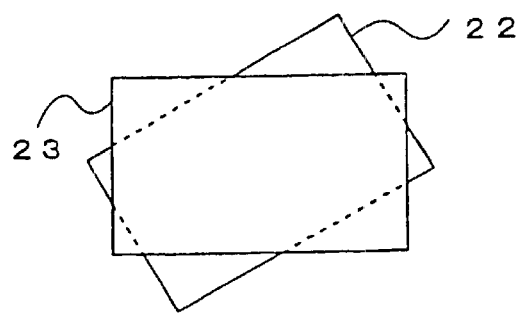
(c) 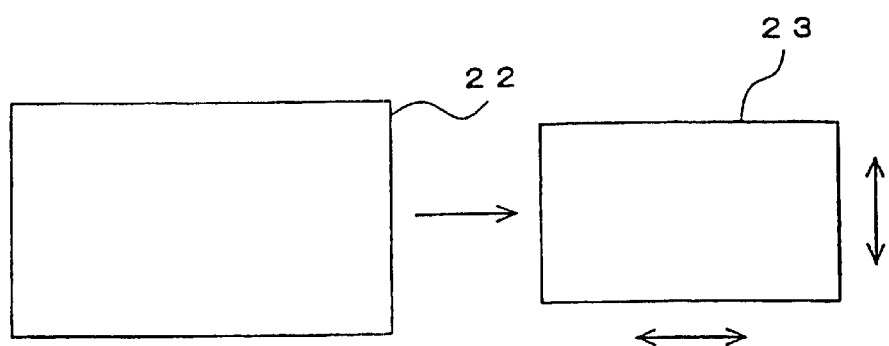

EXPOSURE METHOD AND SCANNING-TYPE EXPOSURE APPARATUS

This application is a continuation of PCT International Application No. PCT/JP98/05854 filed Dec. 24, 1998.

INCORPORATION BY REFERENCE

The disclosure of the following priority application is herein incorporated by reference: Japanese Patent Application No. 10-13431 filed Jan. 7, 1998.

BACKGROUND OF THE INVENTION

1. Field of the Invention

The present invention relates to an exposure method and a scanning-type exposure apparatus utilized in a photolithography process implemented to manufacture semiconductor devices, liquid crystal display devices, thin-film magnetic heads or the like, and more specifically, it relates to an exposure method and a scanning-type exposure apparatus that are ideal in application for exposing a substrate that has become deformed during the manufacturing process.

2. Related Art

The use of liquid crystal display devices as display elements in personal computers, television sets and the like has become increasingly extensive in recent years. Such a liquid crystal display device is manufactured by laminating a plurality of pattern layers constituting transparent electrode layers and switching elements on a glass substrate. These pattern layers are patterned through photolithography. During the photolithography process implemented to manufacture a liquid crystal display device, a projection exposure apparatus that projects an image of an original pattern formed on a mask onto the glass substrate via a projection optical system and transfers the pattern onto the glass substrate by photosensitizing a photoresist layer applied on the glass substrate, for instance, is utilized.

An example of such a projection exposure apparatus is now explained in reference to FIGS. 12 and 13, which illustrate a scanning-type exposure apparatus that performs exposure processing on a glass substrate (plate). FIG. 12 is a perspective illustrating a schematic structure of a scanning-type exposure apparatus in the prior art. FIG. 13 illustrates an alignment operation performed to align the mask and the plate in the scanning-type exposure apparatus in the prior art shown in FIG. 12.

In FIG. 12, a plate 22 is held at one sidewall of a carriage 21 having its cross section formed in a U shape and a mask 23 is held at the other sidewall. The pattern in a partial area of the mask 23 held by the carriage 21 is illuminated by exposing light irradiated from an illumination system 24 and as the exposing light having been transmitted through the mask 23 is transmitted through a projection optical system 25, the pattern at the partial area of the mask 23 is transferred onto an area on the plate 22. During such an operation, the carriage 21 is caused to travel over a guide 20 in a specific direction A (the scanning direction) so that the pattern in the entire area on the mask 23 is transferred onto the plate 22.

During the exposure operation described above, the projected image of the pattern formed at the mask 23 and the pattern layer that is already formed on the plate 22 must be accurately aligned with each other. Accordingly, an alignment operation is performed to align the mask 23 and the plate 22.

In order to implement this alignment operation, alignment marks formed on the mask 23 and alignment marks formed on the plate 22 are observed with alignment microscopes 26 and 27 to correct the positional relationship between the mask 23 and the plate 22 by detecting any positional misalignment between them. The plate 22 and the mask 23 are each provided with a plurality of alignment marks formed at the two ends along direction Y, which are formed to extend along direction X, and one or a plurality of these alignment marks are observed through the alignment microscope 26 or 27. Based upon the results of detections performed by using the alignment microscopes 26 and 27, the position of the plate 22 relative to the mask 23, the size of the plate 22 relative to the mask 23 and the like are ascertained, and using such information, the position of the mask 23 is adjusted or the magnification power of the projection optical system 25 is corrected.

For instance, if it is detected through the alignment microscopes 26 and 27 mentioned above that the plate 22 and the mask 23 are offset from each other in parallel along direction X and direction Y, as illustrated in FIG. 13(a), the mask 23 is caused to move in parallel over a specific distance by driving an actuator 28 that moves a mask table 32 holding the mask 23 along direction X and driving two actuators 29 and 30 that move the mask table 32 along direction Y (shift correction).

In addition, if there is a rotational misalignment between the plate 22 and the mask 23 around the Z axis, as illustrated in FIG. 13(b), the mask 23 is caused to rotate by a specific quantity by varying the degrees to which the actuators 29 and 30 are driven (rotation correction). If the sizes of the mask 23 and the plate 22 do not match relative to each other, as illustrated in FIG. 13(c), the magnification power of the projection optical system 25 is corrected along direction Y and the magnification power along direction X is corrected by driving the actuator 28 along direction X to move the mask 23 indirection X while the carriage 21 is engaged in a scanning movement and change the relative scanning speed of the mask 23 and the plate 22 by a specific degree (scaling correction).

In more specific terms, if the plate 22 extends along direction X by 4 ppm, for instance, the actuator 28 must be driven to move the mask 23 by 4 ppm in the opposite direction from the scanning direction as the carriage 21 engages in a scanning operation.

It is to be noted that the alignment marks at the mask 23 are formed in advance when the mask is formed, whereas the alignment marks at the plate 22 are normally formed during the initial exposure processing.

A plate that is delivered to a projection exposure apparatus to be exposed usually undergoes a plurality of heat treatments during the process and undergoes repeated exposure of the original pattern over a plurality of layers. Expansion or contraction of the plate mainly attributable to the heat treatments implemented in the process may result in deformation of the plate. For instance, after the plate undergoes various process, a plate having a rectangular planar shape with individual sides each extending almost linearly, as illustrated in FIG. 14(a), may become warped with a curvature along direction Y as illustrated in FIG. 14(b) or become deformed into a parallelogram shape, as illustrated in FIG. 14(c).

When exposing a plate that has become deformed, as illustrated in FIG. 14(b) or FIG. 14(c), the degree of deformation along direction Y successively changes as it travels along direction X for scanning during an exposure operation, and this poses a problem in that full alignment correction cannot be achieved through the shift correction, the rotation correction or the scaling correction in the prior art. A pattern that is exposed without an accurate alignment manifests a significant alignment overlay error relative to the base pattern, which results in a problem in that the characteristics of numerous elements formed on the plate become inconsistent among the individual areas of the plate.

An object of the present invention is to provide an exposure method and a scanning-type exposure apparatus that achieve accurate alignment for a deformed substrate.

SUMMARY OF THE INVENTION

The object described above is achieved with an exposure method for exposing a substrate with a pattern formed on a mask by synchronously moving the mask and the substrate, comprising a step in which any change in the shape of the substrate is detected and a step in which the relative positions of the mask and the substrate are corrected during the synchronous movements based upon the results of the detection results.

In addition, in the exposure method according to the present invention, the pattern on the mask may be projected onto the substrate by a projection optical system. Also, in the correction step, the mask may be moved in a direction roughly perpendicular to the direction of the synchronous movements and the direction of the optical axis of the projection optical system.

In the exposure method according to the present invention, any change in the shape of the substrate may be detected based upon a state of alignment of at least three alignment marks provided along the direction of the synchronous movements of the mask and the substrate in the step for detecting change in the shape of the substrate, and the results of the detection may be approximated to functions represented by at least two straight lines or curves to correct the relative positions based upon the functions.

In addition, the object described above is achieved in a scanning-type exposure apparatus that exposes a substrate with a pattern formed on a mask by synchronously moving the mask and the substrate, comprising detection devices that detect any change in the shape of the substrate and correction mechanisms that correct the relative positions of the mask and the substrate during the synchronous movements based upon the results of the detection.

The scanning-type exposure apparatus according to the present invention may be further provided with projection optical systems that projects the pattern of the mask onto the substrate. Furthermore, in the scanning-type exposure apparatus according to the present invention, the projection optical system may be provided with a plurality of erect non-reverse image projection lenses. In the scanning-type projection apparatus according to the present invention, which is further provided with a magnification power adjustment mechanism that adjusts the projection magnification power of the projection optical systems, the correction mechanism may control the magnification power adjustment mechanisms based upon the results of the detection. Moreover, the scanning-type exposure apparatus according to the present invention may be provided with a positional adjustment mechanism that adjusts the position of the pattern projected onto the substrate by the projection optical system. By utilizing the magnification power adjustment mechanism and the positional adjustment mechanism in combination, any deformation occurring at the substrate can be dealt with so that the pattern on the mask is accurately transferred onto the substrate.

In addition, the exposure method according to the present invention described above includes a step in which the projection magnification power of the projection optical system is adjusted during the synchronous movements. Also, in the exposure method according to the present invention, the projection optical system comprises a plurality of erect non-reverse image type projection lenses and portions of projection areas of the plurality of projection lenses overlap to be exposed each other, so that above-noted exposure is performed.

In addition, the exposure method according to the present invention described above includes a step in which the position of the pattern projected onto the substrate by the projection optical system is adjusted during the synchronous movements. In this exposure method, the mask is moved along a direction substantially perpendicular to the direction of the synchronous movements and the direction of the optical axis of the projection optical system in the correction step. Furthermore, the exposure method includes a step in which the projection magnification power of the projection optical system is corrected during the synchronous movements.

Moreover, in the scanning-type exposure apparatus according to the present invention described above, the correction mechanism drives a mask stage holding the mask along a direction substantially perpendicular to the direction of the synchronous movements and the direction in which the optical axis of the projection optical system extends.

BRIEF DESCRIPTION OF THE DRAWINGS

FIG. 13 illustrates alignment implemented in the prior art; and

DESCRIPTION OF THE PREFERRED EMBODIMENTS

Figure 1:
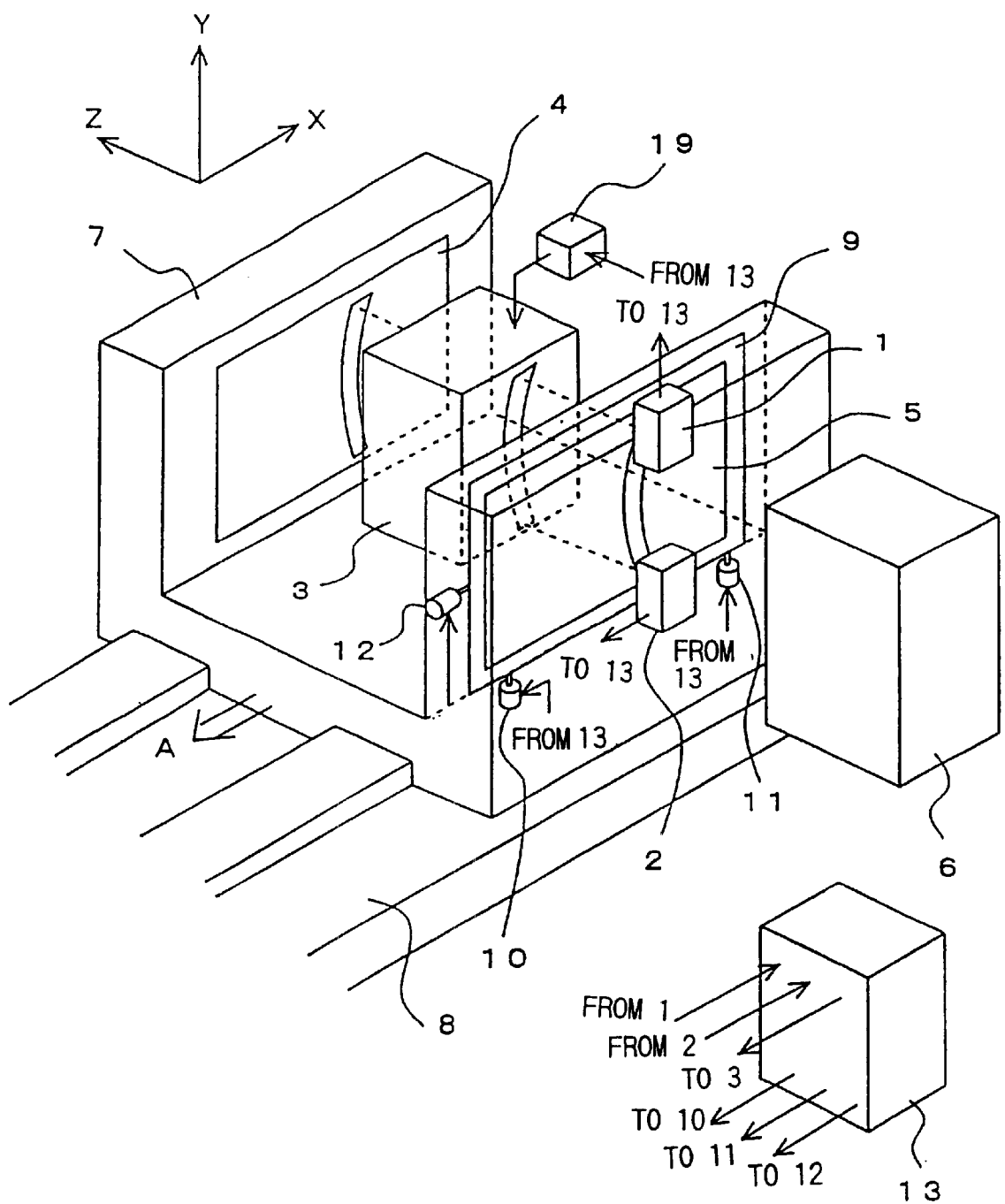
FIG. 1 is a perspective illustrating a schematic structure of the scanning-type exposure apparatus in a first embodiment of the present invention.
Figure 2A:
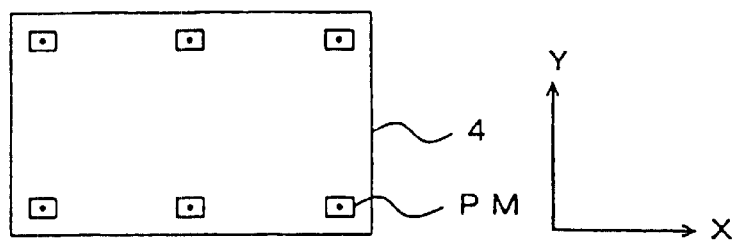
FIG. 2 illustrates alignment of the mask and the plate.
Figure 2B:
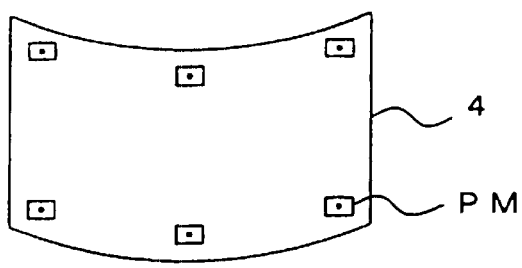
Figure 2C:
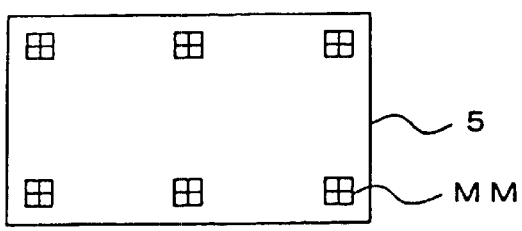
Figure 2D:
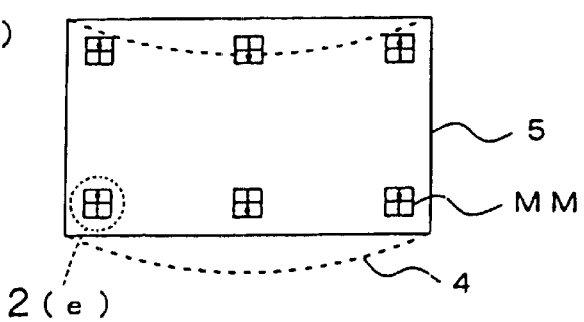
Figure 2E:
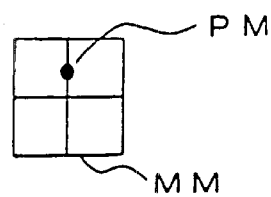
Figure 3:
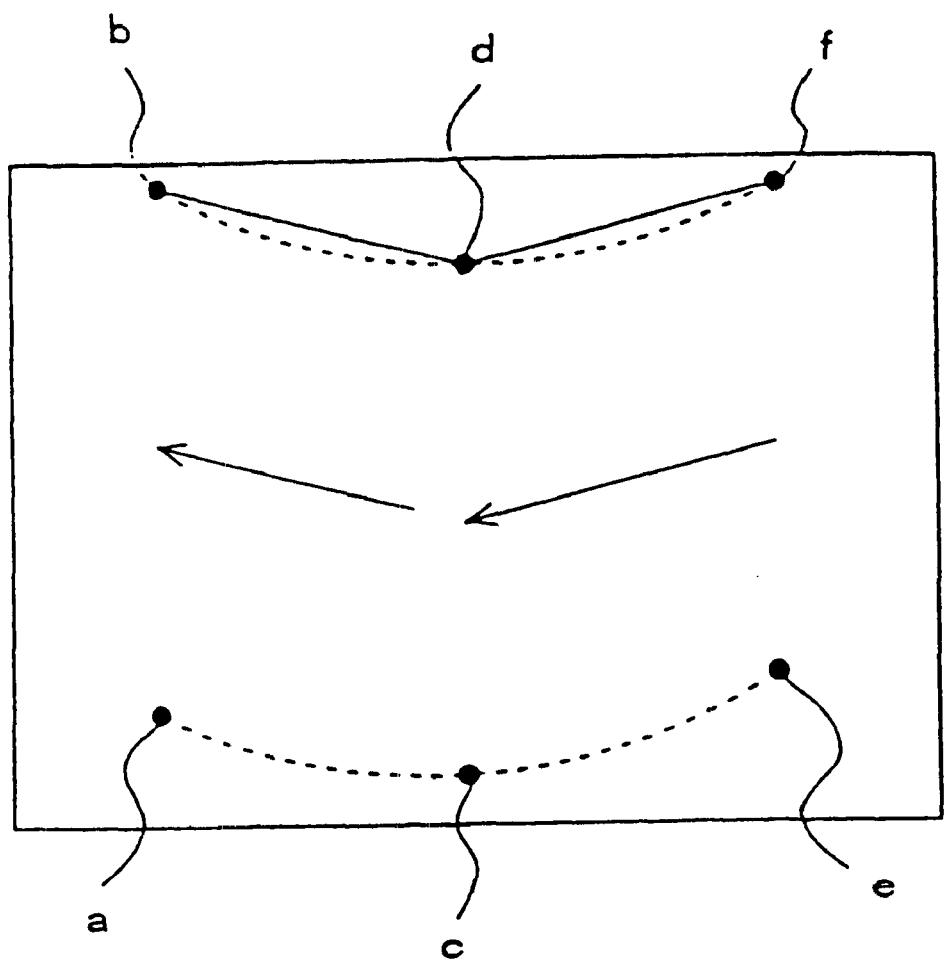
FIG. 3 illustrates the exposure method achieved in the first embodiment of the present invention.
Figure 4:
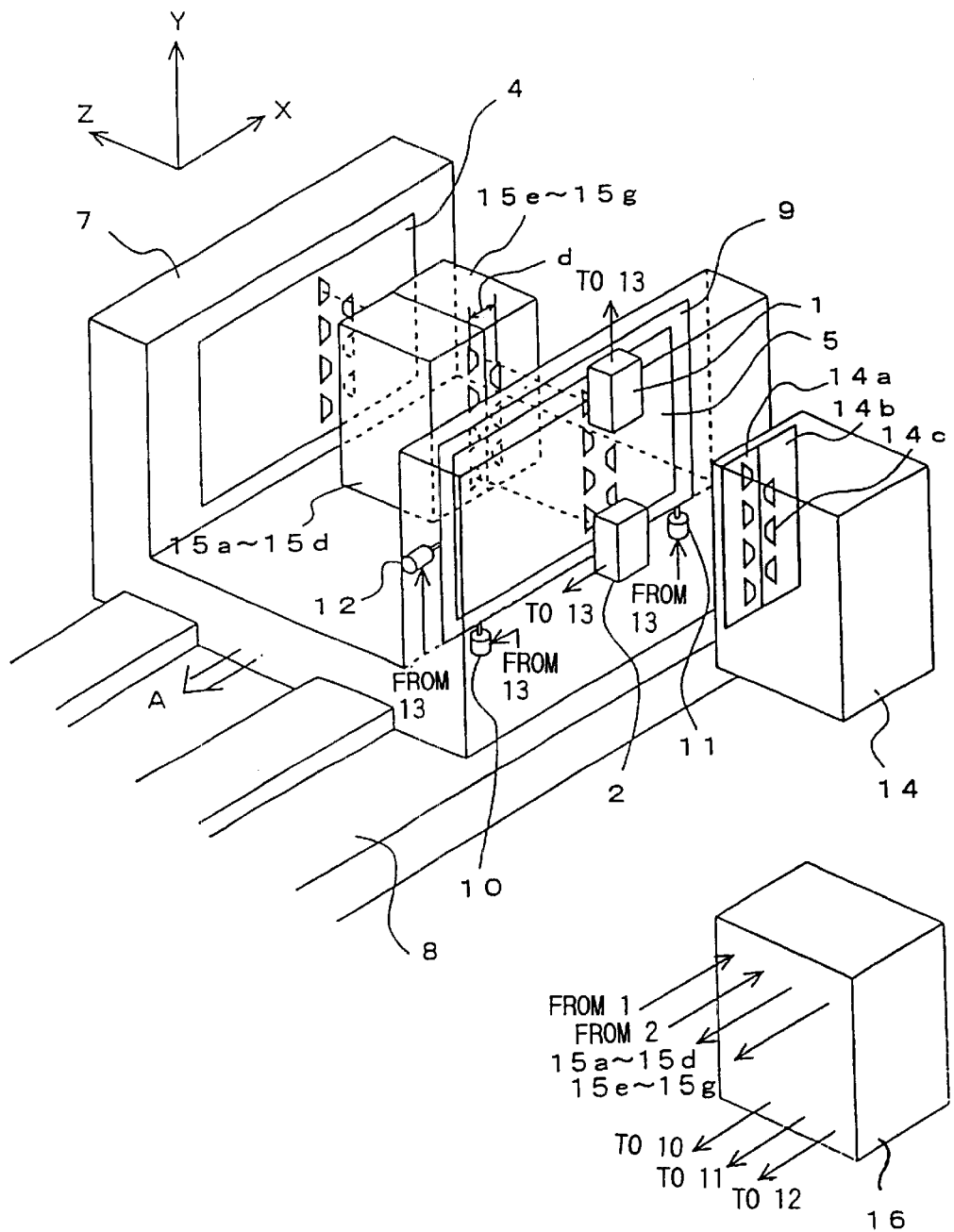
FIG. 4 is a perspective illustrating a schematic structure of the scanning-type exposure apparatus in a second embodiment of the present invention.

The scanning-type exposure apparatus in the first embodiment of the present invention is now explained in reference to FIGS. 1~3. It is to be noted that the disclosures made on the scanning-type exposure apparatus in U.S. Pat. No. 5,602,620, U.S. Pat. No. 5,617,181 and application Ser. No. 08/743096 filed to the U.S. Patent Office on Nov. 4th, 1996 by this applicant now U.S. Pat. No. 5,999,244 are incorporated in this specification. First, a schematic structure of the scanning-type exposure apparatus in the embodiment is explained in reference to FIG. 1. It is to be noted that in FIG. 1, the Z axis is taken in parallel to the optical axis of a projection optical system 3, the X axis is taken along the direction of scanning by a carriage 7 and the Y axis is taken along a direction perpendicular to the Z axis and the X axis.

This scanning-type exposure apparatus is provided with the carriage 7 having a cross section formed in a U-shape, and the carriage 7 is caused to travel along direction A on a guide 8 by a drive mechanism (not shown). The carriage 7 is provided with a plate table (not shown) at one of its sidewalls and a mask table 9 at another sidewall so that when a plate 4 and a mask 5 are held at the plate table and the mask table 9 respectively, the plate 4 and the mask 5 face opposite each other. In addition, a plurality (3 in this embodiment) of actuators 10~12 are provided at the carriage 7, and these actuators 10~12 enable the mask table 9 to travel along the direction of the X axis, the direction of the Y axis and the rotating direction over the X-Y plane to change the position of the mask 5 relative to the position of the plate 4.

The scanning-type exposure apparatus is further provided with an illumination system 6 that radiates exposing light. The illumination system 6 comprises an illumination aperture and an optical integrator (not shown) to illuminate a portion of the mask at a constant illumination intensity. The projection optical system 3 is provided between the mask 5 and the plate 4, facing opposite the illumination system 6. The projection optical system 3 projects the pattern over a portion of the mask 5 as an erect image (an image achieving a positive lateral magnification along the vertical direction and the horizontal direction) onto a portion of the plate 4 with the exposing light having passed through the mask 5. As a result, with the mask 5 and the plate 4 traveling along the direction indicated by the arrow A simultaneously as the carriage 7 moves, the entire pattern on the mask 5 is transferred onto the entire surface of the plate 4. In addition, the projection optical system 3, which is constituted of a plurality of projection lens groups, assumes a structure that allows the pressure levels and the like of the gas between the individual projection lens groups to be adjusted and is provided with a magnification power adjustment mechanism 19 that is capable of adjusting the projection magnification power at which the pattern is projected by adjusting the pressure levels of the gas and the like.

The scanning-type projection apparatus is further provided with alignment microscopes 1 and 2 at the mask side toward the illumination system 6. Individual optical axes of the alignment microscopes 1 and 2 are set along the direction parallel to the optical axis of the projection optical system 3 so that the plate 4 can be observed via the mask 5 and the projection optical system 3. These alignment microscopes 1 and 2 detect alignment marks at the mask 5 and the plate 4 prior to a scanning-type exposure operation and outputs the results of the detection to a control device 13. It is to be noted that the alignment microscope 1 and the alignment microscope 2 are set over a distance from each other along the direction of the Y axis in the figure so that the alignment marks provided along direction +Y relative to the centers of the mask 5 and the plate 4 are observed through the alignment microscope 1 and that the alignment marks provided along direction −Y relative to the centers of the mask 5 and the plate 4 are observed through the alignment microscope 2.

The control device 13 performs a shift correction and a rotation correction similar to those achieved in the prior art based upon the results of the detection output by the alignment microscopes 1 and 2, and also ascertains the shape of the plate 4 to obtain functions that approximate the change in the shape of the plate 4 along the direction of the Y axis relative to the scanning direction and to detect the deformation rate of the plate width along the direction of the Y axis occurring at the plate 4 relative to the scanning direction. Furthermore, the control device 13 drives the actuators 10~12 in conformance with the functions obtained as described above as the carriage 7 travels in the scanning direction to cause the mask table 9 to move and also implements control on the magnification power adjustment mechanism 19 in conformance with the detected deformation rate to change the projection magnification power of the projection optical system 3.

Next, an exposure method achieved by utilizing the scanning-type exposure apparatus in the embodiment is explained.

First, an explanation is given on an alignment operation performed prior to the scanning exposure processing in reference to FIG. 2. FIG. 2(a) shows a plate 4 that is not deformed. A plurality of alignment marks P M (two in FIG. 2(a)) are provided along the direction parallel to the Y axis and a plurality of sets of alignment marks P M (three sets in FIG. 2(a)) are provided along the direction parallel to the X axis at the plate 4 in this state. FIG. 2(b) shows the plate 4 that has become deformed during the process. In this state, the alignment marks P M are displaced relative to their positions in FIG. 2(a) as a result of the deformation of the plate 4. FIG. 2(c) shows the mask 5. At the mask 5, a plurality of alignment marks M M (two in FIG. 2(c)) are provided along a direction parallel to the Y axis and a plurality of sets of alignment marks M M (three sets in FIG. 2(c)) are provided along the direction parallel to the X axis, in correspondence to the alignment marks P M at the plate 4 shown in FIG. 2(a). FIG. 2(d) illustrates a state in which the deformed plate 4 shown in FIG. 2(b) and the mask 5 in FIG. 2(c) are held at the carriage 7.

In the state shown in FIG. 2(d), the alignment microscopes 1 and 2 first observe the alignment marks M M on the mask 5 and also observe the alignment marks on the plate 4 via the mask 5 and the projection optical system 3. FIG. 2(e) shows superimposed images of the alignment marks P M and M M at the lower left position in FIG. 2(d) in an enlargement. The results of the detection of the alignment marks P M and M M at the plate 4 and the mask 5 along the directions X and Y are output to the control device 13. The control device 13 calculates the quantities of misalignment between the alignment marks P M and M M at the mask 5 and the plate 4 along directions X and Y based upon the results of the detections and drives the actuators 10~12 by specific quantities in conformance to the quantities of misalignment thus obtained to implement a shift correction and a rotation correction so that the misalignment between the corresponding alignment marks P M and M M at the plate 4 and the mask 5 closest to the area that is exposed first in, for instance, scanning-type exposure, is minimized.

Next, an operation performed to obtain functions that approximate a change in the shape of the plate is explained in reference to FIG. 3. In FIG. 3, the positions of the alignment marks at the plate 4 detected by the alignment microscopes 1 and 2 are indicated as black dots. In this figure, individual alignment marks are assigned with codes a~f for differentiation.

Based upon the results of the detections performed by the alignment microscopes 1 and 2, the control device 13 calculates functions that express the deformation that has occurred at the plate 4 by using the positional information with respect to the alignment marks a~f. For instance, functions of two straight lines connecting the alignment marks b, d and f are obtained.

During this operation, functions of;two straight lines connecting the alignment marks a, c and e, for instance, may be obtained instead of the functions mentioned above, or functions achieved by averaging the straight lines connecting the alignment marks a, c and e and the straight lines connecting the alignment marks b, d and f may be obtained. Functions expressed as $((a1+a3)/2) \times X$ and $((a2+a4)/2) \times X$ may be used. Here, a1 represents the inclination of the straight line connecting the alignment marks b and d, a2 represents the inclination of the straight line connecting the alignment marks d and f, a3 represents the inclination of the straight line connecting the alignment marks a and c, and a4 represents the inclination of the straight line connecting the alignment marks c and e.

In addition, in order to implement a magnification power correction, the control device 13 ascertains the ratio of the distance of the alignment marks provided along the direction of the Y axis at the plate 4 relative to the direction of the X axis and the distance of the corresponding alignment marks provided along the direction of the Y axis at the mask 5, i.e., the deformation rate manifesting at the plate 4 along the direction of the Y axis relative to the direction of the X axis.

Next, the operation performed during exposure processing is explained.

After the plate 4 is held at one of the sidewalls of the carriage 7 and the mask 5 is held at the other sidewall, exposing light is irradiated by the illumination system 6 to illuminate the pattern in a partial area of the mask 5 held by the carriage 7. The pattern in the partial area of the mask 5 is transferred onto a partial area on the plate 4 via the projection optical system 3. While the pattern is being transferred in this manner, the control device 13 causes the carriage 7 to travel in the scanning direction A along the guide 8 and implements control on the actuators 10~12 in correspondence to the calculated functions to move the mask table 9. Let us consider a situation in which the mask table 9 is moved based upon functions obtained with regard to the alignment marks b, d and f in FIG. 3 as an example. a1 represents the inclination of the straight line connecting the alignment marks b and d and a2 represents the inclination of the straight line connecting the alignment marks d and f. When exposing an area distanced from the alignment mark b by X 1 along the direction of the X axis between the alignment marks b and d, the mask table 9 is moved from the position corresponding to the alignment mark b by $a1 \times X1$ or $((a1+a3)/2) \times X1$ along the direction of the Y axis. When exposing an area distanced from the alignment mark d by X 2 along the direction of the X axis between the alignment marks d and f, the mask table 9 is moved from the position corresponding to the alignment mark d by $a2 \times X2$ or $((a2+a4)/2) \times X2$ along the direction of the Y axis.

In addition, the control device 13 adjusts the projection magnification power of the projection optical system 3 in correspondence to the deformation rate of the plate manifesting along the direction of the Y axis along with movement of the mask table 9, as described above.

By moving the carriage 7 by a specific distance along the scanning direction in this manner, the pattern of the entire area on the mask 5 is transferred onto the plate 4.

Since the exposure processing is performed by moving the mask in conformance to the shape of the deformed plate as explained above, the pattern on the mask is correctly transferred onto the plate. In addition, since the size of the pattern image is changed in correspondence to the width of the deformed plate, the pattern is correctly transferred onto the plate.

Next, the scanning-type exposure apparatus in the second embodiment of the present invention is explained in reference to FIGS. 4~11. First, an explanation is given on a schematic structure of the scanning-type exposure apparatus in this embodiment in reference to FIG. 4. It is to be noted that the same reference numbers are assigned to components achieving identical functions and effects to those in the scanning-type exposure apparatus in the first embodiment to preclude the necessity for repeated explanation thereof.

In an illumination system 14 of this scanning-type exposure apparatus, an illumination field aperture units 14a and 14b are provided over two rows. The illumination field aperture units 14a and 14b are each provided with a plurality of field apertures 14c each having a trapezoidal opening for defining an exposing light irradiation area at the mask 5 and the field apertures 14c at the illumination field aperture unites are arranged in a staggered pattern.

In this embodiment, four field apertures 14c are provided at the illumination field aperture unit 14a and three field apertures 14c are provided at the elimination field aperture unit 14b. The ends of the field apertures 14c at the illumination field aperture units 14a and 14b along direction Y overlap each other by a specific quantity viewed from direction X when the illumination field aperture units 14a and 14b are set at the reference positions. The end area over which the field apertures 14c overlap each other by a specific quantity along direction X is to be referred to as a stitching area. During a scanning exposure operation, the areas of the plate 4 corresponding to the stitching areas is exposed with a mask pattern image passing through the stitching areas on both the illumination field aperture units 14a and 14b, so that an optimal accumulated exposure quantity is achieved.

In addition, the distance between the central positions of the field apertures at the illumination field aperture unit 14a along direction X and the central positions of the field apertures at the illumination field aperture unit 14b along direction X is set at d.

Figure 5:
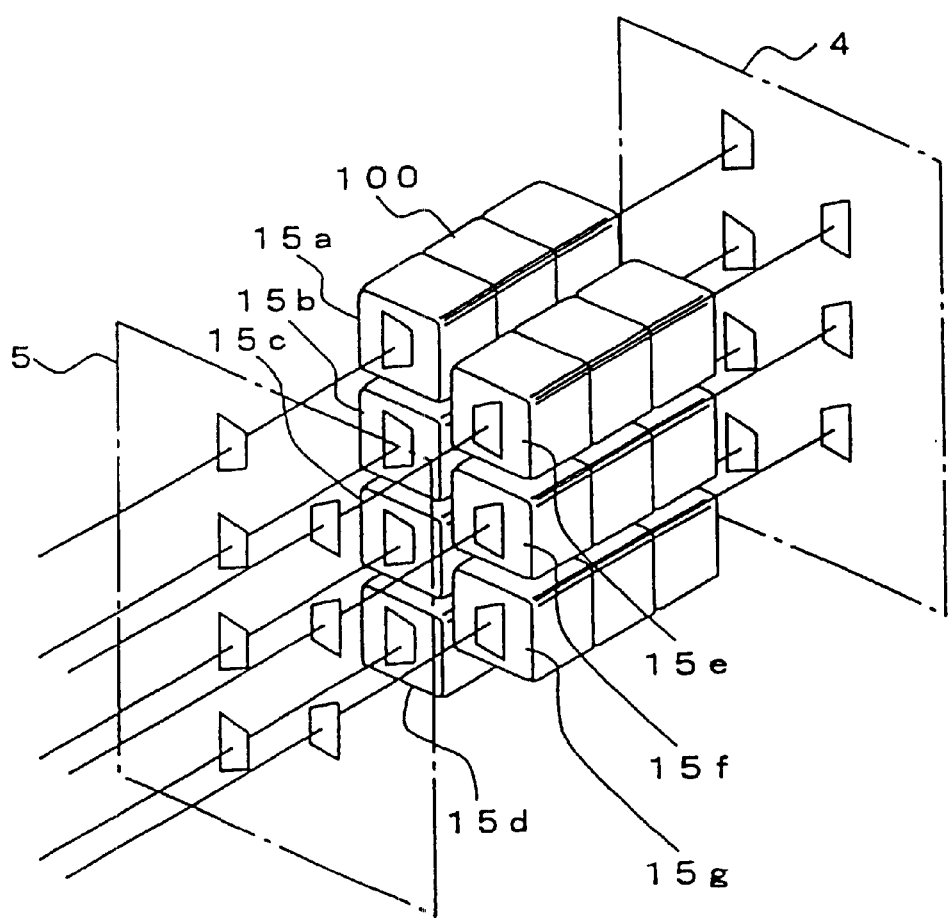
FIG. 5 illustrates the image formation characteristics adjustment mechanism 100 at the projection optical system 15.

The scanning-type exposure apparatus is further provided with seven projection optical systems 15a~15g arrayed in a staggered pattern in correspondence to the arrangement of the individual field apertures 14c in order that the pattern on an irradiation area of the mask 5 defined by each of the field apertures 14c on the illumination field aperture units 14a and 14b is transferred onto the plate 4. The projection optical systems 15a~15g are provided over two rows each of which extends along direction Y. Each projection optical system corresponds to an irradiation area on the mask 5 defined by one of the field apertures 14c. Furthermore, as illustrated in FIG. 5, an image formation characteristics adjustment mechanism 100 is provided for each of the two rows of projection optical systems, i.e., the projection optical systems 15a~15d (hereafter referred to as a first projection row) and the projection optical systems 15d~15g (hereafter referred to as a second projection row). Each image formation characteristics adjustment mechanism 100 comprises a shifter unit that shifts an image of the pattern on the mask 5 to be transferred onto the plate 4 in correspondence to the movement of the mask 5 along direction Y and a magnification power adjustment unit that adjusts the magnification power at which the image of the pattern on the mask 5 is transferred onto the plate 4. The shifter unit shifts the image of the pattern on the mask 5 transferred to the plate 4 by tilting or rotating a transparent plane parallel glass. In addition, the magnification power adjustment unit is constituted of a magnification power adjustment lens. It is to be noted that the magnification power adjustment unit may be constituted of the magnification power adjustment mechanism 19 in the first embodiment instead of the magnification power adjustment lens. The image formation characteristics adjustment mechanism 10 is controlled by the control device 16.

The distance between the optical axes of the projection optical systems in the first projection row and the optical axes of the projection optical systems in the second projection row along direction X, too, is set at d.

Next, an exposure method achieved in the scanning-type exposure apparatus in this embodiment is explained. Since the procedure that is followed to perform a scanning-type exposure operation along direction X moving the mask table 9 along direction Y to correct the relative positions of the plate 4 and the mask 5 along direction Y based upon the deformation that has occurred at the plate 4 is essentially similar to that explained in reference to the first embodiment, its explanation is omitted. However, it is necessary in a scanning-type exposure apparatus having a plurality of projection optical systems 15a~15g provided in a staggered pattern along direction Y over two rows apart from each other in direction X as in this embodiment, to change the positions of the pattern images transferred onto the plate 4 by the plurality of projection optical systems 15a~15g along direction Y as the mask 5 moves in direction Y. It is to be noted that in the scanning-type exposure apparatus in the first embodiment, since a single projection optical system 3 projects all the pattern images in direction Y, above noted consideration is unnecessary.

Figure 6:
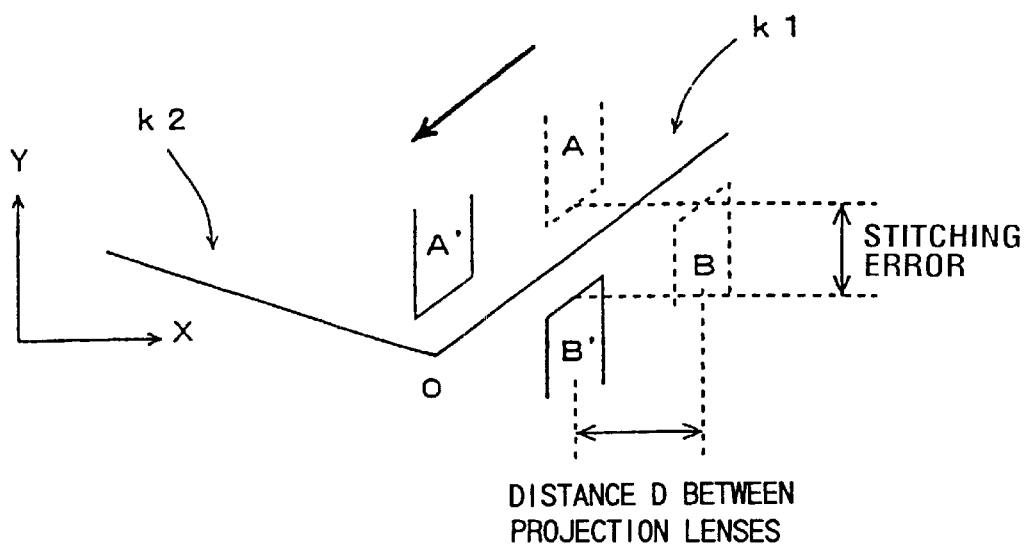
FIG. 6 illustrates a stitching error occurring in the exposure method in the second embodiment of the present invention.
Figure 7:
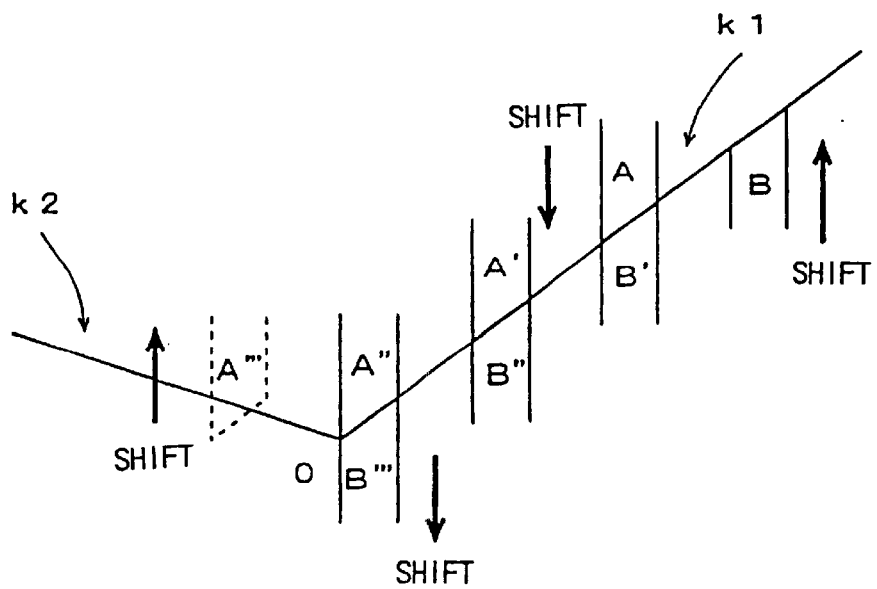
FIG. 7 illustrates an operation performed to prevent a stitching error from occurring in the exposure method in the second embodiment of the present invention.

In reference to FIGS. 6 and 7, a method for optimizing the positions of the pattern images along direction Y transferred onto the plate 4 by the plurality of projection optical systems 15a~15g while the mask 5 moves in direction Y is explained.

FIG. 6 illustrates projected images in exposure areas on the plate 4 defined by the field apertures 14c while a scanning-type exposure operation is in progress. Based upon the observation made through the alignment microscopes 1 and 2, the deformation that has occurred at the plate 4 is defined by two straight lines K1 and K2 in advance. After the scanning-type exposure operation starts, scanning-type exposure is first performed up to the position O by gradually shifting the mask 5 along, for instance, direction +Y in correspondence to the position along direction X based upon the straight line K1. Once the scanning-type exposure is completed up to the position O, the mask 5 is gradually shifted along direction −Y based upon the straight line K2. FIG. 6 presents an example in which the control device 16 does not drive the shifter units of the image formation characteristics adjustment mechanisms 100 in FIG. 5 in correspondence to the movement of the mask 5 along direction Y. In FIG. 6, an area A indicates a portion of the projected image projected through the projection optical systems 15a~15d in the first projection row at a first time point. Whereas an area A' indicates a portion of the projected image projected through the projection optical systems 15a~15d in the first projection row at a second time point which succeeds the first time point when the mask 5 has moved along direction Y concurrently with a scanning movement in direction X. In addition, an area B indicates a portion of the projected image projected through the projection optical systems 15e~15g in the second projection row at the first time point. Whereas an area B' indicates a portion of the projected image projected through the projection optical systems 15e~15g in the second projection row at the second time point which succeeds the first time point when the mask 5 is moved along direction Y concurrently with the scanning movement in direction X. As shown in the figure, while the projection area undergoes a relative shift by a specific distance along direction Y between the first time point and the second time point, the positional relationship between the projection areas of the first projection row and the second projection row along direction Y does not change.

However, if the mask 5 is corrected in the positional relationship as shown in FIG. 6 during scanning exposure, a problem arises in that the stitching accuracy in the stitching area where portions of the first projection row and the second projection row should overlap to be exposed becomes poor depending upon the distance d between the optical axes of the first projection row and the second projection row. Hereafter, this problem is referred to as a stitching error.

Accordingly, in the exposure method in the embodiment, the respective shifter units of the image formation characteristics adjustment mechanisms 100 corresponding to the projection optical systems 15a~15d in the first projection row and the respective shifter units of the image formation characteristics adjustment mechanisms 100 corresponding to the projection optical systems 15e~15g in the second projection row are driven in synchronization with the movement of the mask 5 along direction Y to shift the pattern images to be transferred onto the plate 4 along direction Y, as illustrated in FIG. 7, thereby to prevent occurrence of any stitching error. As shown in FIG. 7, by shifting the positions of the projection optical systems 15a~15d in the first projection row and the positions of the projection optical systems 15e~15g in the second projection row along direction Y by specific distances, exposure that is free of any stitching error is achieved. Because, a stitching area B projected by the second projection row is exposed with the stitching area indicated as the area A' subsequently projected by the first projection row.

Each shift amount which is applied respectively to the projection optical systems 15a~15d in the first projection row and the projection optical systems 15e~15g in the second projection row is determined by using the distance d between the first projection row and the second projection row and the inclination a of the approximate curve K1, for instance, as −a×d/2 and a×d/2, respectively.

When the projected image B projected by the projection optical systems of the second projection row has reached an inflection point O while the mask 5 having been driven in conformance with the approximate curve K1 and the projection optical systems of the first projection row and the second projection row having been driven through the procedure explained in reference to FIG. 7 above, the pattern images of the second projection row are shifted by the specific distance to conform to the inclination of the straight line K2. Then, when the projection image A projected by the projection optical systems of the first projection row has reached the inflection point O, the pattern images of the first projection row are shifted by a specific distance to conform to the inclination of the straight line K2. Thus, even the mask 5 moves along direction Y in conformance with the straight line K2, the image of the pattern on the mask 5 can be accurately transferred onto the plate 4, free of any stitching error.

Figure 8:
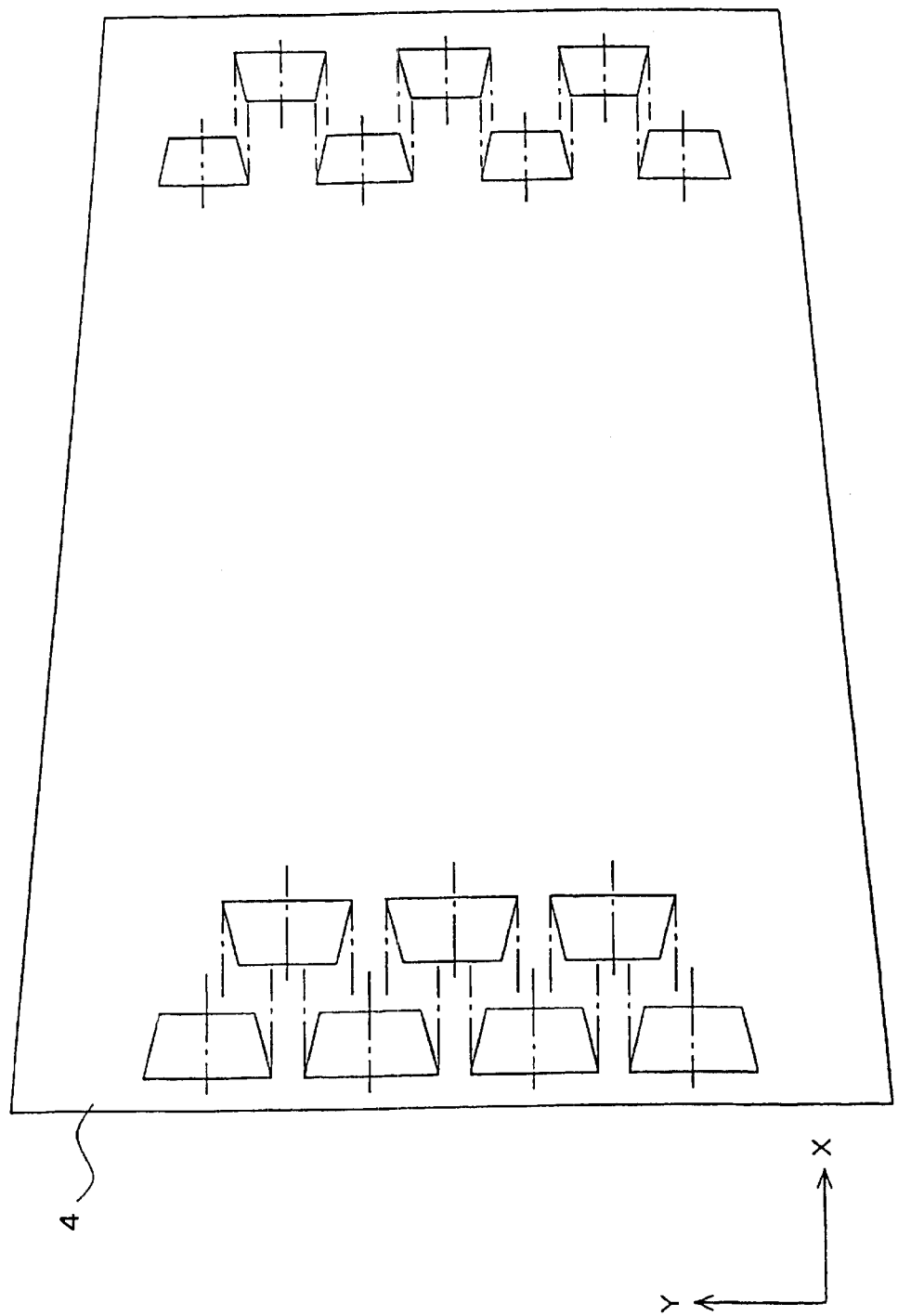
FIG. 8 shows the plate 4 having become deformed into a trapezoidal shape.
Figure 9:
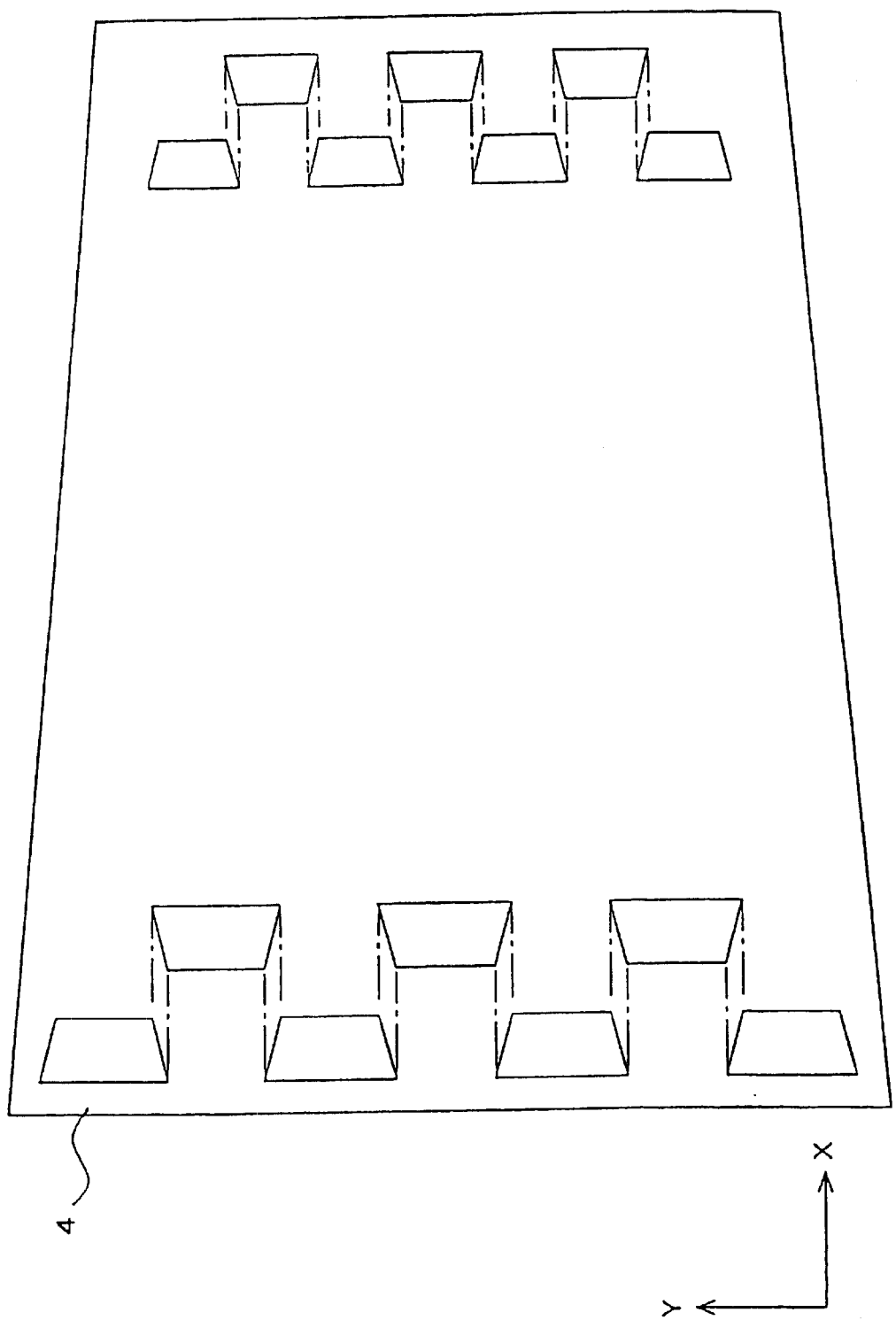
FIG. 9 shows the plate 4 having become deformed into a trapezoidal shape.

FIGS. 8 and 9 illustrate an example in which pattern images are transferred to the plate 4 that have become deformed into trapezoidal shapes.

FIG. 8 shows the pattern images projected by using only the magnification power adjustment units at the individual image formation characteristics adjustment mechanisms 100 corresponding to the projection optical systems 15a~15d in the first projection row and the projection optical systems 15e~15g in the second projection row. When only the magnification power adjustment units at the image formation characteristics adjustment mechanisms 100 are driven as shown in FIG. 8, the mask pattern cannot be transferred with accuracy due to positional deviation or misalignment of the portion of the projection area of the projection optical systems 15a~15d in the first projection row and the portion of the projection area of the projection optical systems 15e~15g in the second projection row. Accordingly, in this embodiment, both the magnification power adjustment units and the shifter units of the individual image formation characteristics adjustment mechanisms 100 corresponding to the projection optical systems 15a~15d and 15e~15g in the first and second projection rows are driven. More specifically, when enlarging the size of the pattern image by 10 ppm, the position of the pattern image transferred to the plate 4, too, is shifted by 10 ppm. Thus, as illustrated in FIG. 9, any misalignment of the area over which a portion of the projection areas of the projection optical systems 15a~15d in the first projection row and the portion of the projection areas of the projection optical systems 15e~15g in the second projection row should overlap to be exposed with the same pattern images can be prevented. It is obvious that the mask 5 should be driven along direction Y as necessary while the magnification power adjustment units and the shifter units of the image formation characteristics adjustment mechanisms 100 are driven during scanning-type exposure.

The present invention is not limited to the embodiments described above and allows for a number of variations.

Figure 10:
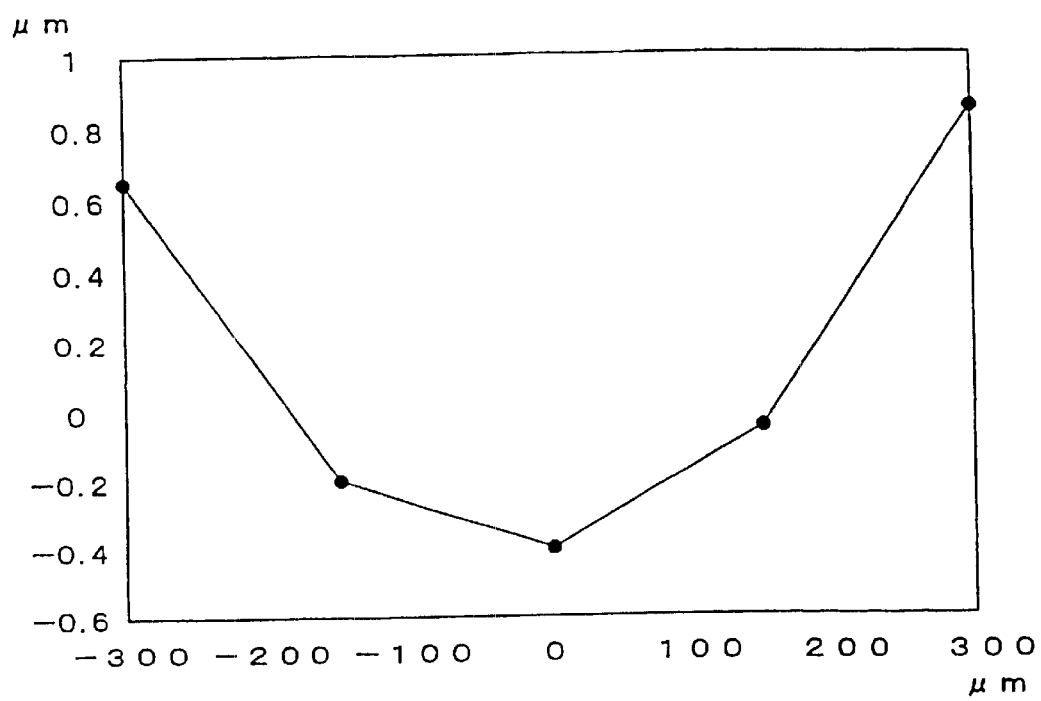
FIG. 10 shows another method of obtaining approximate functions based upon the positions of the plurality of alignment marks in the exposure methods in the first and second embodiments of the present invention.
Figure 11:
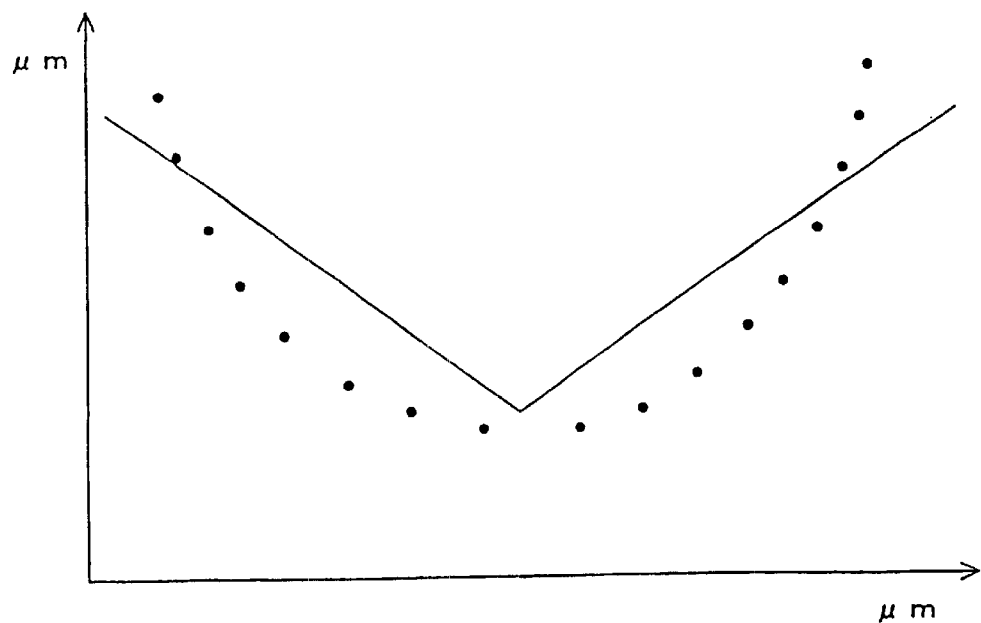
FIG. 11 shows yet another method of obtaining approximate functions based upon the positions of the plurality of alignment marks in the exposure methods in the first and second embodiments of the present invention.
Figure 12:
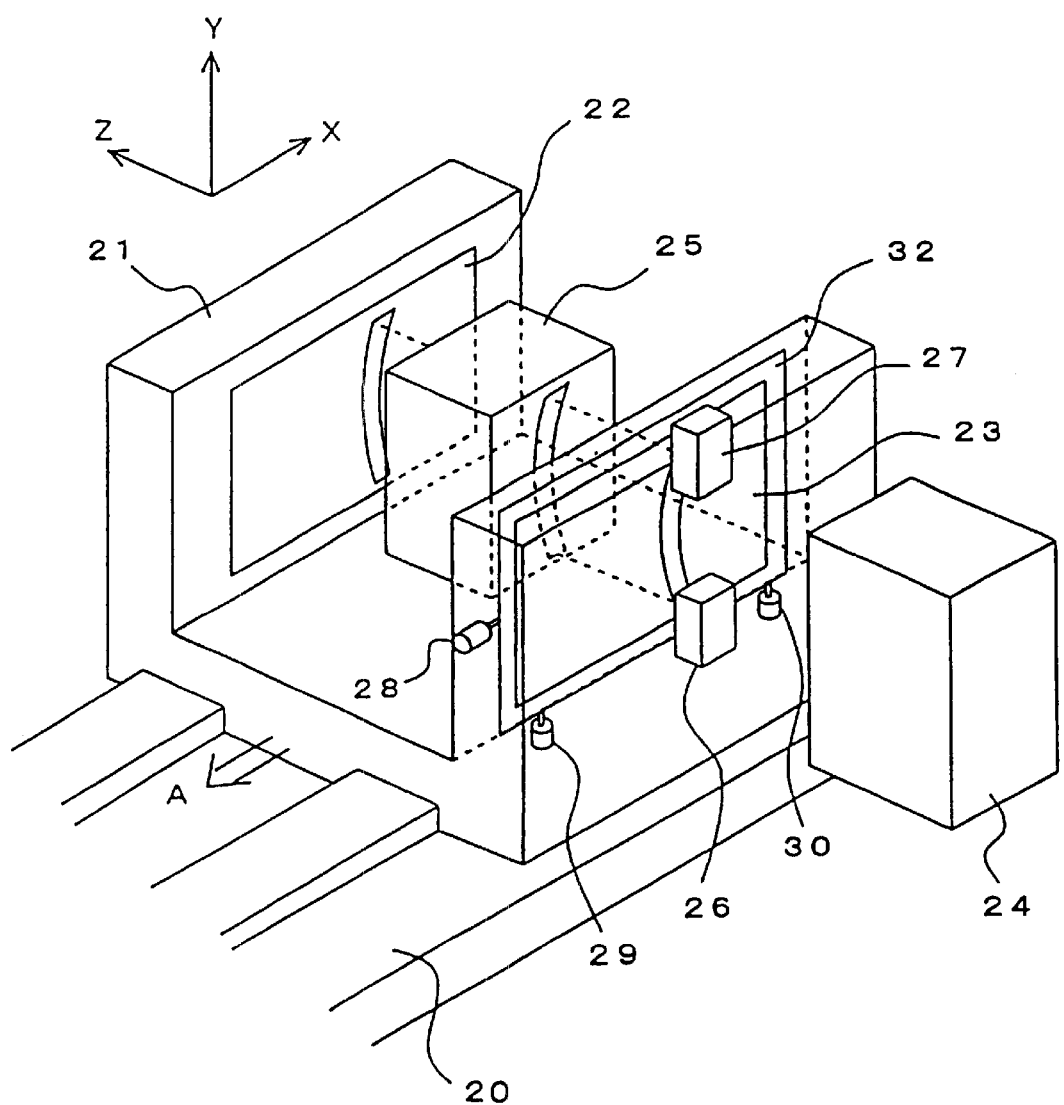
FIG. 12 is a perspective illustrating a schematic structure of a scanning-type exposure apparatus in the prior art.
Figure 14:
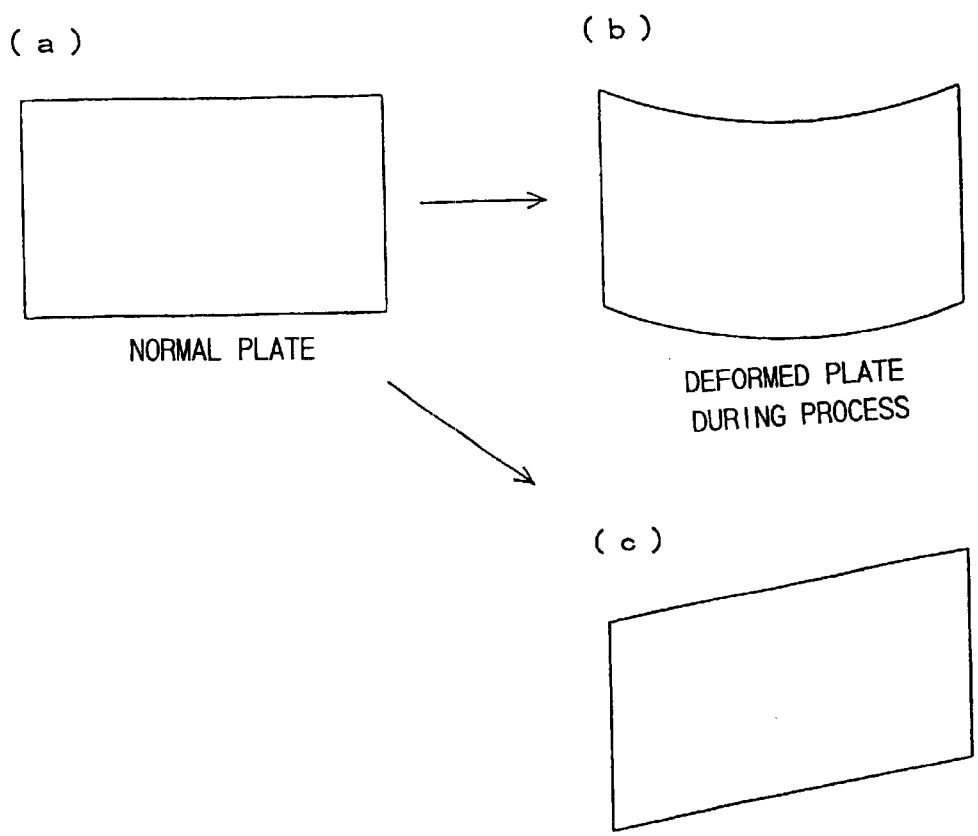
FIG. 14 illustrates deformations of the plate occurring during the process.

For instance, the position of the mask 5 along direction Y is controlled through approximation using two straight lines based upon the positions of the alignment marks at three points as explained in reference to FIG. 3 in the embodiment. However, the present invention is not limited to this example. Namely, the mask may be moved along an approximate curve achieved through approximation using (n−1) straight lines obtained by measuring the positions of n (4 or more) alignment marks, as illustrated in FIG. 10, instead. Alternatively, as illustrated in FIG. 11, the positions of numerous (n) alignment marks may be measured and then approximation to two straight lines may be achieved through the method of least squares by measuring. Or a curve approximation may be achieved through application of a higher order with respect to the positions of numerous alignment marks by adopting the method of least squares, although this would necessitate more complex control of the movement of the mask 5 along direction Y.

In addition, the scanning-type exposure apparatus may hold the plate 4 and the mask 5 along the horizontal direction or it may hold the plate 4 and the mask 5 independently of each other without using the carriage 7.

INDUSTRIAL APPLICABILITY

As explained above, according to the present invention, an exposure method and a scanning-type exposure apparatus that achieve exposure unaffected by any deformation of the substrate are realized. Thus, when a plurality of layers are exposed with a mask pattern images, exposure is made with mask pattern images that are accurately aligned is achieved.

What is claimed is:

1. An exposure method for exposing a substrate with a pattern formed on a mask by synchronously moving said mask and said substrate, comprising:
   a step in which a change in the shape of said substrate is detected by using at least three marks, each of which is provided along a direction of the synchronous movements of said mask and said substrate; and
   a step in which the relative positions of said mask and said substrate are corrected during the synchronous movements based upon said detection results which have been approximated to functions of at least two straight lines or curves, the relative positions being corrected based upon said functions.

2. An exposure method according to claim 1, wherein; said pattern on said mask may be projected onto said substrate by a projection optical system.

3. An exposure method according to claim 2, wherein; in said correction step, said mask is moved in a direction roughly perpendicular to the direction of said synchronous movements and a direction in which an optical axis of said projection optical system extends.

4. An exposure method according to claim 2, further comprising;
   a step in which a projection magnification power of said projection optical system is adjusted during said synchronous movements.

5. An exposure method according to claim 2, wherein; said projection optical system comprises a plurality of erect non-reverse image type projection lenses and portions of projection areas of said plurality of projection lenses overlap to be exposed each other, so that said exposure is performed.

6. An exposure method according to claim 5, further comprising;
   a step in which the position of said pattern projected onto said substrate by said projection optical system is adjusted during said synchronous movements.

7. An exposure method according to claim 6, wherein; said mask is moved along a direction substantially perpendicular to the direction of synchronous movements and the direction of an optical axis of said projection optical system in said correction step.

8. An exposure method according to claim 7, further comprising;
   a step in which a projection magnification power of said projection optical system is adjusted during said synchronous movements.

9. A scanning-type exposure apparatus that exposes a substrate with a pattern formed on a mask by synchronously moving said mask and said substrate, comprising:
   a detector that detects a change in a shape of said substrate; and
   a correction mechanism that approximates to functions of at least two straight lines or curves in accordance with a detection result of said detector to correct the relative positions of said mask and said substrate during said synchronous movements.

10. A scanning-type exposure apparatus according to claim 9, further comprising;
    a projection optical system that projects said pattern on said mask onto said substrate.

11. A scanning-type exposure apparatus according to claim 10, wherein;
 said projection optical system is provided with a plurality of erect non-reverse image projection lenses.

12. A scanning-type exposure apparatus according to claim 10, further comprising;
 a magnification power adjustment mechanism that adjusts the projection magnification power of said projection optical system, wherein;
 said correction mechanism implements control on said magnification power adjustment mechanism based upon said detection results.

13. A scanning-type exposure apparatus according to claim 10, further comprising;
 a positional adjustment mechanism that adjusts the position of said pattern projected onto said substrate by said projection optical system.

14. A scanning-type exposure apparatus according to claim 13, wherein;
 said correction mechanism drives a mask stage holding said mask along a direction substantially perpendicular to the direction of said synchronous movements and a direction of an optical axis of said projection optical system.

15. A scanning-type exposure apparatus according to claim 10 further comprising;
 a magnification power adjustment mechanism that adjusts a projection magnification power of said projection optical system; and
 a positional adjustment mechanism that adjusts the position of said pattern projected onto said substrate by said projection optical system.

16. An exposure method for exposing a substrate with a pattern formed on a mask by synchronously moving said mask and said substrate in a first direction, comprising the steps of:
 detecting a change in the shape of said substrate along a second direction different from the first direction;
 moving the mask with a first movement component in the second direction during the synchronous movement of said mask and substrate in the first direction based upon the detected change in the shape of said substrate; and
 moving the mask with a second movement component different from the first movement component in the second direction during the synchronous movement in the first direction based upon the detected change in the shape of said substrate.

17. An exposure method according to claim 16, wherein the first movement component is opposite to the second movement component.

18. An exposure method according to claim 17, wherein said pattern on said mask is projected onto said substrate by a projection optical system.

19. An exposure method according to claim 18, further comprising:
 changing magnification of the projection optical system during the synchronous movement.

20. An exposure method according to claim 19, further comprising:
 adjusting a position of the pattern projected onto said substrate during the synchronous movement.

* * * * *